United States Patent
Ohsumi et al.

[11] Patent Number: 6,001,537
[45] Date of Patent: Dec. 14, 1999

[54] METHOD OF FORMING A LAYER HAVING A HIGH PRECISION PATTERN AND LAYER

[75] Inventors: Kouichi Ohsumi, Shiga-ken; Toshiaki Takagi, Ohmihachiman, both of Japan

[73] Assignee: International Business Machines Corporation, Armonk, N.Y.

[21] Appl. No.: 08/755,056

[22] Filed: Nov. 22, 1996

[30] Foreign Application Priority Data

Feb. 5, 1996 [JP] Japan .................................. 8-019187

[51] Int. Cl.[6] ................................................ G03F 7/26
[52] U.S. Cl. ........................................ 430/313; 430/324
[58] Field of Search ................................ 430/311, 313, 430/315, 322, 324, 329

[56] References Cited

U.S. PATENT DOCUMENTS

| | | | |
|---|---|---|---|
| 5,053,318 | 10/1991 | Gulla | 430/315 |
| 5,149,615 | 9/1992 | Chakravorty | 430/313 |
| 5,158,860 | 10/1992 | Gulla | 430/315 |
| 5,266,446 | 11/1993 | Chang | 430/314 |

*Primary Examiner*—Kathleen Duda
*Attorney, Agent, or Firm*—Steven J. Soucar; Lawrence D. Cutter

[57] ABSTRACT

A method for patterning an insulative layer with high precision to accommodate the pitch reduction of wiring conductors and forming insulating layers that are superior in insulation performance, migration resistance, etc. is disclosed. According to the method, there are provided a first step of forming a pattern having openings on a surface by using a high resolution material, a second step of forming an insulating layer of a reliable second insulating material in spaces between the residual first resist material and a third step of removing the residual resist material. The pattern formation is preferably performed by using an ultraviolet-curable resin, to form a precision pattern. Since a highly reliable, thermosetting resin remains on the substrate in an actual product, superior properties of migration resistance and adhesiveness with the substrate can be obtained.

16 Claims, 5 Drawing Sheets

METHOD OF FORMING A LAYER HAVING A HIGH PRECISION PATTERN AND LAYER

TECHNICAL FIELD

The present invention relates to a method for forming a pattern of an insulating material, particularly an organic material, at a fine pitch on a substrate. In particular, the invention relates to a method for forming, at a high density, a pattern of dams of insulating materials to define conductive members to be formed on wiring pads, a pattern of openings for bump formation, or like patterns and a layer made by the method.

BACKGROUND OF THE INVENTION

In printed wiring boards and multiple-pin ball grid array (BGA) packages, it is increasingly required that the wiring density be increased. Increased density requires that the interval of a conductor pattern that is formed on a substrate becomes very small. For example, about five years ago, the width of wiring lines themselves was about 150 microns ($\mu$m) and the pitch of pads was about 650 $\mu$m. However, at present, the width of wiring lines and the pitch of pads are less than 75 $\mu$m and less than 200 $\mu$m, respectively. There even exist such types that the line width is about 50 $\mu$m and the pitch is about 125 $\mu$m. As such, the wiring density has tripled or quadrupled in these several years. A technology is now required which accommodates the above trend.

The core of the technology for accommodating the increase in the wiring density relates to the formation of wiring layers themselves. Along with this, a decreased pitch of the wiring layers requires development of a method for forming a precision pattern of insulating layers, made of, e.g., organic material, around the wiring layers.

In a conventional technique for shaping an organic material layer into a given pattern, first a resin layer is formed by applying a liquid ultraviolet-curable resin (commonly referred to as a photoresist or resist) to a substrate, and then unnecessary portions of the resin layer are removed by exposure and development with the use of a certain mask. This technique is used very widely even today, because it can provide the highest productivity and form a precision pattern to a certain extent.

However, to attain a small pitch that is in the above-mentioned range, there occur problems with currently available ultraviolet-curable resins. The problems are associated with the resist (a specific example is a resist that reacts and sets upon illumination with ultraviolet rays; also called "solder resist"). The resins most commonly used for industrial purposes as resists are required to satisfy not only a high resolution property but also other various properties, which are opposed to those required for high resolution. For example, for a solder resist or the like to become a permanent protection film it should be highly reliable. The reliability, which is a very broad concept, is often defined as a collective concept including a low possibility of occurrence of diffusion phenomena such as migration between wiring layers and good adhesiveness with a substrate. Many other properties required include high mounting performance and high adaptability to a manufacturing process (specifically, a low possibility of occurrence of solder balls due to post-flux repulsion and high adhesiveness with a sealing resin for fixing mounting parts). The ultraviolet-curable resist might accommodate the above-mentioned pitch reduction if the high precision property were the only requirement. However, actually the ultraviolet-curable resist is required to satisfy a variety of conflicting properties, and currently there does not exist a single ultraviolet-curable resist which satisfy all of the properties required. Problems associated with a variety of properties required for the ultraviolet-curable resist will be described later in terms of specific problems with formation of resist dams.

The resist dam is a post-shaped portion made of an insulating material such as a resist. The resist dam is formed in the vicinity of a conductive pad formed on a substrate, and serves as a dam for preventing solder on the conductive pad from contacting with an adjacent conductive pad. That is, the resist dam is a dam made of a resist which serves to prevent solder from short-circuiting adjacent wiring conductors. In other words, the resist dam has a role of preventing the occurrence of what is called solder bridging. The technique itself of preventing solder bridging by means of a dam of an insulative layer is known as disclosed in Published Unexamined Utility Model Application No. 57-163764. This utility model application discloses a structure which prevents short-circuiting of conductive members by forming dams of insulative layers in the vicinity of the conductive members.

A technique of patterning an insulative layer at a fine pitch is necessary to forming resist dams. FIG. 1 shows a general appearance of resist dams. FIG. 1 is a top view of wiring conductors. As shown in FIG. 1, wiring conductors 2 are formed on a substrate and an insulating layer 3 is so formed as to generally cover the entire structure. Windows 4 are formed in the insulating layer 3 immediately above pads 2a (that are tip portions of the wiring conductors 2) to thereby partially expose the pads 2a. This becomes more apparent by referring to FIG. 2(a), which is a sectional view taken along line 2a—2a in FIG. 1. Referring to FIG. 2(a), the wiring conductors 2a are formed on the substrate 1 and resist dams 3a are formed between the wiring conductors 2. It is seen from comparison with FIG. 1 that the resist dams 3a constitute part of, that is, continuous with, the insulating layer 3 and are defined by the windows 4. As a matter of fact, when solder 5 is formed on the pads 2a, it is actually formed only on the pads 2a by virtue of the existence of the resist dams 3a. If it were not for the resist dams 3a, solder formed on one pad 2a may contact with the adjacent pad 2a, to cause short-circuiting. This phenomenon is called solder bridging.

FIGS. 3–6 show a background art method for forming resist dams. As shown in FIG. 3, a number of pads 2a are formed on the substrate 1 in a predetermined pattern. The substrate may be any of a ceramic substrate, a glass substrate, and an organic resin substrate. Next, as shown in FIG. 4, a liquid resist 3 of an ultraviolet-curable type, which is on the market, is applied to the substrate 1 and the pads 2a. Next, as shown in FIG. 5, the liquid resist 3 is exposed to ultraviolet rays with the use of an exposure mask 7. In this operation, openings (hatched portions) of the mask 7 are positioned immediately above the pads 2a. Thereafter, as shown in FIG. 6, portions of the liquid resist 3 are removed by development. As a result, resist layers remain at desired positions to form resist dams 3a between the wiring conductors 2a.

The use of this resist dam technique to fine-pitch wiring conductors is disclosed in prior applications. For example, Published Unexamined Patent Application No. 2-272791 discloses a structure in which solder resists are provided in the spaces between wiring pads and at least a part of pad peripheries that are continuous with the spaces in a case where the spaces between the pads are too narrow to form resist dams. In this application, because of the narrow spaces between the wiring pads, the resist dam formation itself is replaced by another technique. Further, Published Unexamined Patent Application No. 6-252540 discloses a technique of making resist dams that are formed in the vicinity of metal pads higher than the total height of the pads and solder formed thereon. Higher resist dams would be somewhat effective in preventing solder bridging in forming fine-pitch wiring conductors. However, this application does not disclose any technique of effectively forming dams of insulative layers at very narrow gaps between the fine-pitch wiring lines, and therefore cannot be considered a proposal of an essential solution.

As the pitch of wiring conductors is reduced, the problem of migration between the wiring conductors becomes more likely to occur. Migration is a phenomenon in which metal that constitutes a wiring layer is ionized and resulting ions diffuse through a space between insulating layers to finally reach the adjacent wiring layer. Since migration is a diffusion phenomenon, the problems become more serious as the space between wiring conductors is reduced. In general, the diffusion phenomenon occurs between adjacent wiring conductors (see pitch "W" between 2 and 2' in FIG. 1). The migration mechanism becomes apparent by referring to FIG. 2(b), which is a sectional view taken along line 2b—2b in FIG. 1. In the 2b—2b cross-section, the wiring conductors 2 and 2' are completely covered with the insulating layer 3. Migration occurs between the wiring conductors 2 and 2' through the insulating layer 3. In particular, at a present time when the pitch W of the wiring conductors is small (less than 125 $\mu$m), the migration problem comes to exist. One method for preventing this problem is to study the material of the insulating layer 3. One countermeasure would be to select an ultraviolet-curable resist that is highly resistant to migration, but this type of resist is generally low in resolution property. If a resist having a high resolution property is used to attain a fine pitch, the migration resistance is lowered. As such, the resolution and the migration resistance are contradictory properties. This results from the fact that a photo-initiator, a sensitizer, and an amine-type substance which are typically added to increase the resolution of an ultraviolet-curable resist also have effects of increasing free ions in the resin and enhancing the permeability of chlorine ions and alkali ions that are contained in chemicals used in a manufacturing process, thereby making the diffusion phenomenon more active through interaction with moisture, that is, adversely affecting the migration resistance property. Thus, to provide a single ultraviolet-curable resist that satisfies a plurality of contradictory properties is a subject to be attained in connection with the current ultraviolet-curable resist.

More detailed discussions will be made of the relationship between increasing the density of wiring conductors and the migration resistance. In particular, the requirement of increasing the density of wiring conductors is converted into a requirement for a property of the resist, that is, high resolution of a photo-curable resist used in a manufacturing process. On the other hand, the migration resistance is required for a resist as a constituent material of a completed product. As described above, if a resist is used which enables precision patterning to accommodate the pitch reduction, the migration resistance is lowered. Therefore, with the tendency of pitch reduction of wiring conductors, the object of forming resist dams between narrow wiring layer and the object of minimizing the migration between wiring conductors cannot be attained at the same time as long as the same insulating layer (i.e., the resist). This is one aspect of specific problems with formation of resist dams which correspond to the problems associated with a variety of properties required for the resist.

Further, the use of a resist is problematic in terms of formation of a precision pattern. For example, since the resin is in liquid form, it is applied to a substrate first. However, there may occur such defects as blooming and resin sticking in subsequent exposure and development steps. The occurrence of these types of defect is particularly troublesome in forming a precision pattern. This is because in forming a precision pattern, small pattern dimensions more likely cause exposure defects and misregistration. However, since the resin has already photoreacted at a time point when such defects are found, it is difficult to strip off the resin from the substrate, which means that there is no other way than scrapping that substrate. This results in a decrease in production yield.

Thus, if resist dams are formed by using an ultraviolet-curable resist, the production yield will become low though resist dams of a very high precision pattern can be formed. In addition, there is a possibility that quality-related problems such as migration will occur in products.

On the other hand, it is possible to form resist dams by using a thermosetting resist. Thermosetting resists are less likely to cause inferior migration resistance and yield reduction, which are problems associated with ultraviolet-curable resists. However, thermosetting liquid resists are not suitable for forming of resist dams of a precision pattern which is intended by the invention, because they are low in resolution.

The industry seeks a method of making an insulating layer overcoming at least some of the aforementioned short comings.

SUMMARY OF THE INVENTION

An object of the present invention is to provide a technique of patterning an insulative layer with high precision in order to accommodate the pitch reduction of wiring conductors.

Another object of the invention is to provide a technique utilizing a film forming insulating material. Specific examples of the reliability as used herein are migration resistance and adhesiveness with a substrate.

A further object of the invention is to provide a technique for forming resist dams by utilizing the above techniques.

The invention utilizes the fact that an ultraviolet-curable-type insulative layer enables precision patterning because of its high resolution property, and the fact that a thermosetting-type insulating layer is suitable for forming resist dams because of its high migration resistance and superior adhesiveness. That is, precision patterning is performed by using an insulating material. To obtain a highly reliable insulating layer pattern, a photo-curable insulating material is used in the precision patterning stage, and then a highly reliable insulating material such as a thermosetting resist is left in a product. The realization of this method is based on the fact that the contradictory properties of high resolution and high migration resistance are required in different aspects. That is, the former is required for a manufacturing process while the latter is required for a completed product. Therefore, by using insulative layers having properties required for the respective aspects, it becomes possible to attain both properties required such as high resolution and high migration resistance.

Specifically, the invention comprises at least the following three steps. That is, the invention relates to a method comprising at least the first step of leaving a high resolution, photosensitive first insulating material on a surface in a predetermined pattern, the second step of forming an insulating layer of a reliable second insulating material in spaces of the residual first insulating material, and the third step of removing only the first insulating material and leaving only the second insulating material.

With the above method, since the pattern formation is performed by using an ultraviolet-curable resin, a very high precision pattern can be formed. Further, since a highly reliable, thermosetting resin remains on the substrate in an actual product, superior properties of both migration resistance and adhesiveness with the substrate can be obtained.

DETAILED DESCRIPTION OF THE INVENTION

An embodiment of the present invention in which the concept of the invention is applied to resist dams, which are often found on semiconductor devices, will be hereinafter described with reference to FIGS. 7–11. The invention is also applicable to the formation of other precision openings.

Figure 1:
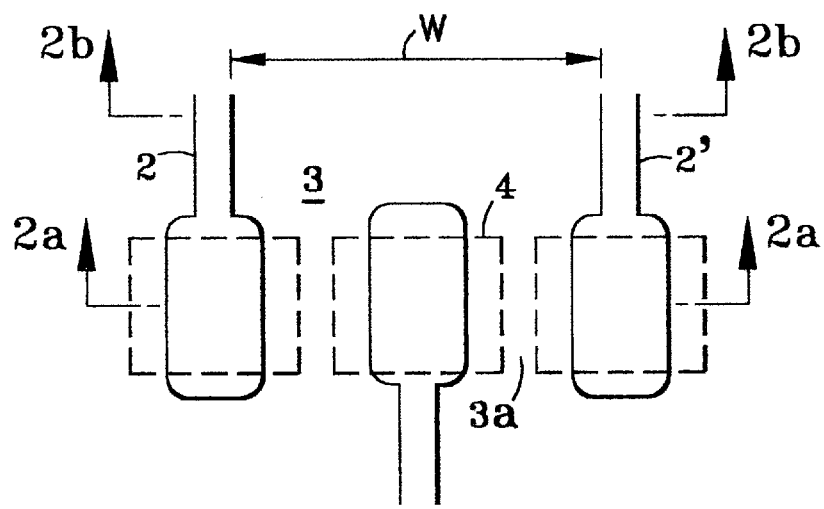
FIG. 1 is a top view of wiring pads formed on a substrate.
Figure 2A:
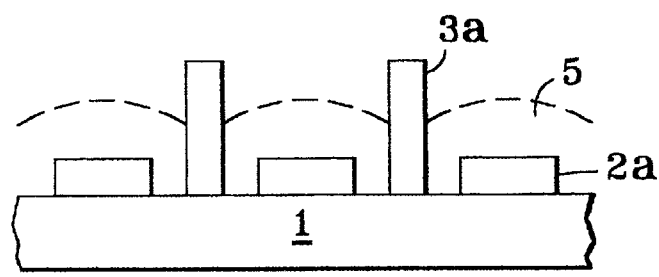
FIG. 2 includes sectional views of the wiring pads formed on the substrate.
Figure 2B:
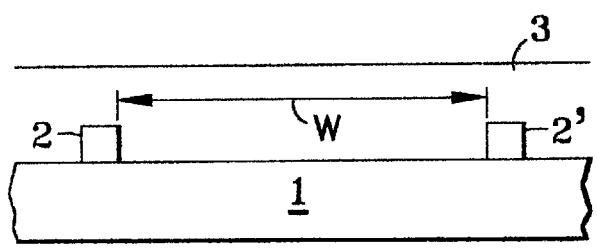
Figure 3:
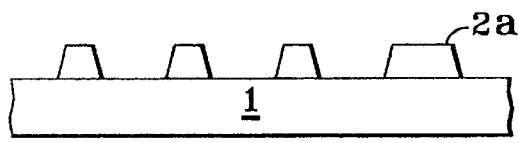
FIGS. 3–6 are sectional views showing the steps of a background art method for forming resist dams.
Figure 4:
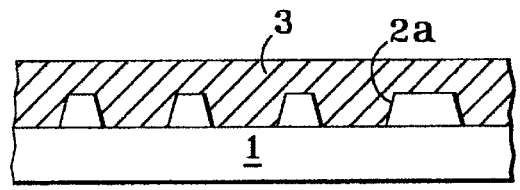
Figure 5:
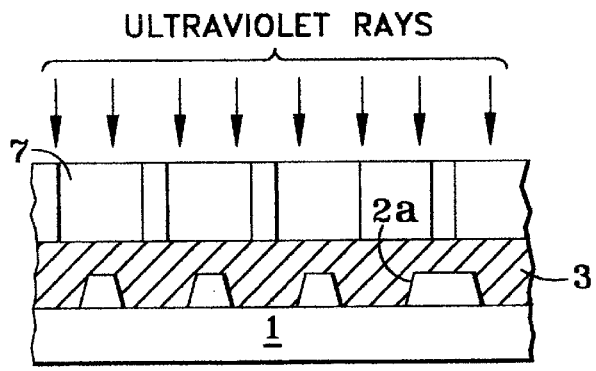
Figure 6:
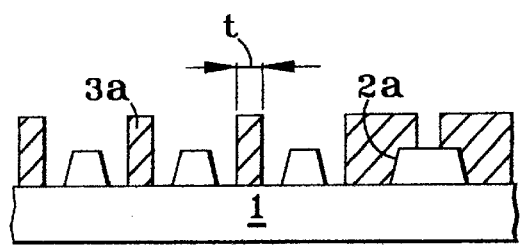
Figure 7A:
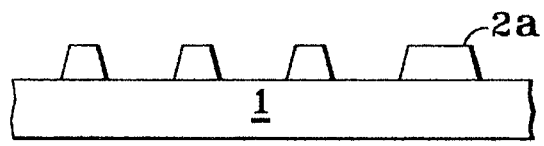
FIGS. 7–11 are sectional views showing the steps of a method for forming resist dams according to the present invention.
Figure 7B:
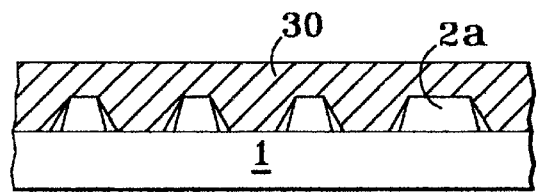
Figure 8:
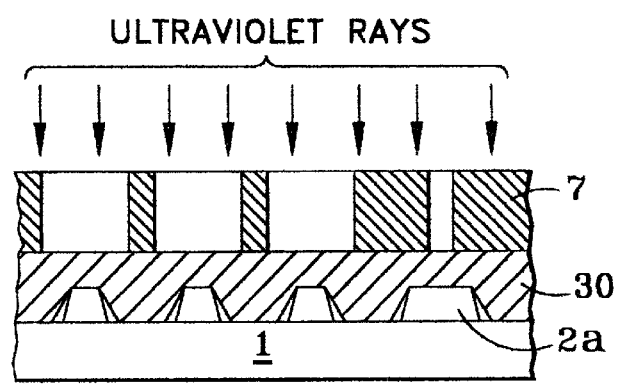

First, as in the conventional technique, wiring conductors 2a are formed on a substrate 1 as shown in FIG. 7a. Next, as shown in FIG. 7b, the substrate 1 and the wiring conductors 2a are covered with an organic material film 30. This is different from the conventional technique which uses an ultraviolet-curable liquid resist. The reason why an organic, ultraviolet-curable material film is preferable used in the invention instead of a conventional liquid resist is that a film made therefrom is easily stripped off after development and therefore is well suited for a removal step (described later) that is performed after the development step, whereby improvements in the ease of operation and the production yield are expected. Therefore, it is possible to use a liquid resist that satisfies the above required properties. The method using an organic material film is disclosed here as a preferred embodiment. The ultraviolet-curable organic material film 30 has very high resolution. Next, as shown in FIG. 8, the organic material film 30 is exposed to ultraviolet rays by using a mask 7. This step corresponds to the FIG. 5 step of the conventional technique, and they are generally similar. However, the two techniques are different in that in the conventional technique the openings (hatched portions) of the mask 7 are located immediately above the wiring conductors 2a, whereas in the invention they are not located immediately above the wiring conductors 2a. Rather, the openings are located adjacent to the conductors 2a in the general vicinity of where the resist dam will be located.

Figure 9:
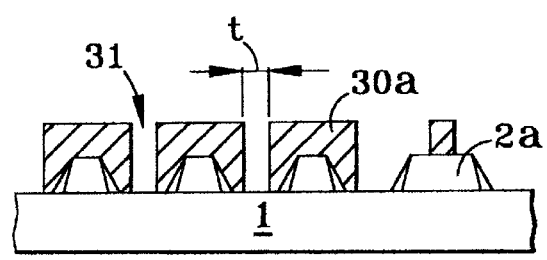
Figure 10A:
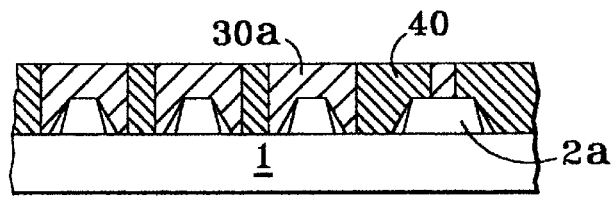
Figure 10B:
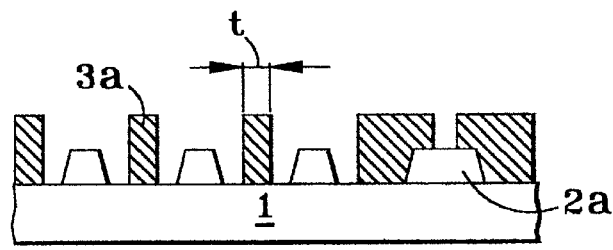

Next, after the development, the film 30 is partially removed, so that organic material film 30a remains only in the vicinity of the pads 2a as shown in FIG. 9. In this step, the film 30 needs superior peeling performance. Thus, spaces 31 remain between the residual organic material films 30a. As shown in FIG. 10a, these spaces 31 are charged with a highly reliable, second organic material 40. In general, the charging of the organic material 40 is performed by a known coating method. The structure of FIG. 10a can also be obtained by charging the spaces between the residual organic material films 30a with an excessive amount of liquid organic material 40 (see FIG. 11), and then grinding the surface. By removing the first organic material film 30a from the structure of FIG. 10a by, for instance, dissolution, resist dams 3a as shown in FIG. 10b can be formed between the wiring conductors 2a.

Although in this invention the film-like organic material 30 is used to facilitate the removal of the first organic material film 30, it suffices to use another material that can be removed easily. Further, although the second organic material is typically a thermosetting resin, the thermosettability is not a requisite and the only requirement is that it can provide a highly reliable resist layer. An example of the thermosetting organic material suitable for use in the invention is a denaturated epoxy resin with a low water-absorbing ability. The second material need not be photopolymerizable.

The term "substrate", as used in it's various grammatical forms, includes the above-described substrate and other elements on which a precision opening is desirable. Another representative substrate is a printed circuit board, which is discussed below in conjunction with EXAMPLE 2.

As described above, the invention uses a material that can be an ultraviolet-curable organic material only for the purpose of patterning an insulating material with high precision. Therefore, a thickness t (see FIG. 10b) of resulting resist dams is equal to a gap t (see FIG. 9) of the residual organic material film 30a. Since the residual organic material film 30a shown in FIG. 9 is preferable made of an ultraviolet-curable organic material, very high precision patterning can be attained. On the other hand, since the finally residual insulating layers are made of a material having high reliability, there can be obtained superior migration resistance, adhesiveness with a substrate, etc. With the above functions, the invention enables formation of fine-pitch, highly reliable resist dams. A pitch of less than 160 microns between two dams can be obtained.

EXAMPLE 1

PREPARATION OF A LAYER

Figure 11:
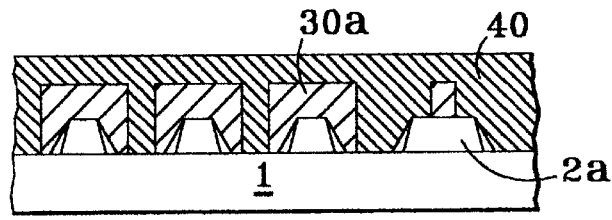

An organic material used, the composition of a solvent used, and a temperature condition, etc. of a specific embodiment of the invention will be hereinafter disclosed in detail. First, as shown in FIG. 7a, wiring conductors 2a are formed on a substrate 1. The substrate 1 is a SLC (surface laminated circuit) substrate, and the wiring conductors 2 is usually made of copper. Next, as shown in FIG. 7b, the substrate 1 and the wiring conductors 2a are covered with an ultraviolet-curable organic material film 30, an example of which is a photosensitive dry film mainly made of polymethylmethacrylate. Next, as shown in FIG. 8, the organic material film 30 is exposed to ultraviolet rays by using a mask 7. This step is generally identical to the conventional technique. However, as described above, the invention is novel in that the openings (hatched portions) of the mask 7 are not located immediately above the wiring conductors 2a. A specific method of this exposure is a known one. For example, the development shown in FIG. 9 is performed by using a sodium carbonate solution or the like in a case where the organic material film is of an alkali development type, to thereby leave organic films 30*a* only in the vicinity of the pads 2*a*. Where the organic material film 30 is of an organic solvent development type, an organic solvent such as 1,1,1-trichloroethane is used. Next, to sufficiently charge the spaces between the organic material films 30*a* with a solder resist 40 of a second organic material as shown in FIG. 11, the solder resist 40 is so applied as to completely cover the wiring conductors 2*a*. For example, the solder resist is a thermosetting resin mainly made of denaturated epoxy resin. In general, the coating method is a known method such as screen printing. As a result, the spaces between the organic material films 31*a* are completely charged. Thereafter, the solder resist is pre-cured into a semi-set state. As is known in the art, the temperature of the pre-curing is 100–170° C. The pre-curing is performed for about 5–60 minutes. Next, the surface of the solder resist 40 is ground to obtain the state of FIG. 10*a*. In general, this grinding is performed by using fine grinding paper or the like. It is important that this operation be performed with sufficient care paid so that the resulting resist dams are not damaged by the solder resist 40 and the organic material film 30 is not stripped off. Thereafter, the organic material film 30 is peeled. The peeling is performed with a known solvent (for instance, sodium hydroxide, methylene chloride, or the like), preferably with an aid of physical force of spraying, for instance. Finally, the solder resist is cured. The curing temperature is set approximately the same as or somewhat higher than the pre-curing temperature. Where it is judged that the pre-curing provides sufficient performance, the curing can be omitted.

Figure 12:
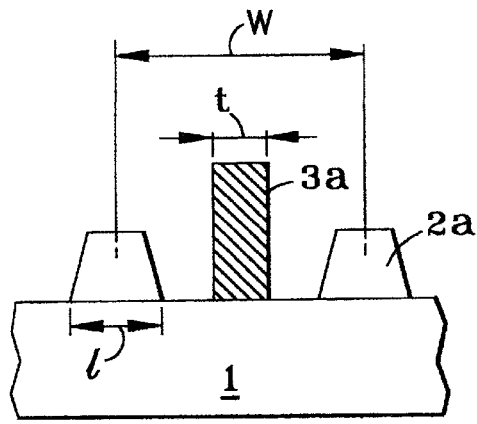
FIG. 12 is a sectional view of resist dams formed according to the invention.

Major dimensions of the resist dams 3*a* and the wiring conductors 2*a* that are obtained by application of the invention are shown in FIG. 12 in terms of symbols. The width 1 of the wiring conductors 2*a* is less than 100 μm, and the invention is most effectively applied when 1 <80 μm. The width t of the resist dams 3*a* is less than 60 μm, and the invention is most effectively applied when t <45 μm. As a result, the pitch W of the wiring conductors at which the invention is most effectively applied is less than about 160 μm. The manufacturing method of the invention is the only one method currently known which uses a highly reliable thermosetting resist or the like as the resist dam material in forming a wiring pattern having a pitch approximately falling within the above range.

EXAMPLE 2

APPLICATION OF THE INVENTION TO OTHER SUBSTRATES

Figure 13:
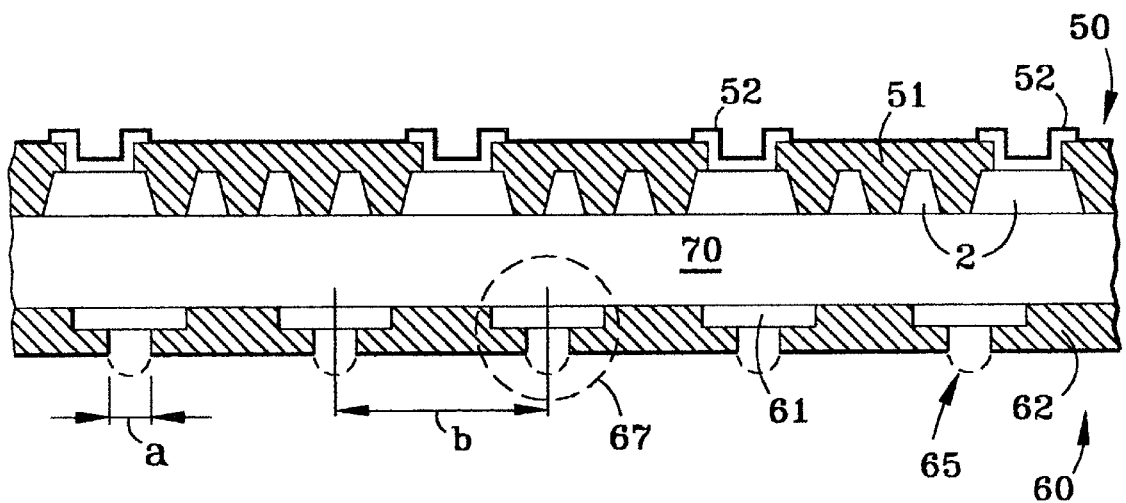
FIG. 13 is a sectional view of a background art printed circuit board.
Figure 14:
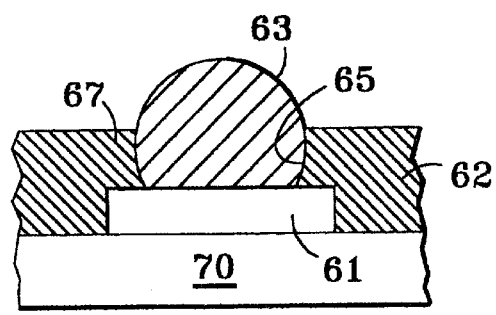
FIG. 14 is a sectional view of a resin layer for bump formation.

The scope of the invention is not limited to the manufacture of mere resist dams, but is also applicable to patterning of very high precision openings. For example, FIG. 13 shows a cross-section of a printed circuit board 70. A top surface 50 of the printed circuit board 70 is formed with wiring conductors 2, an insulating layer 51, and plating layers 52. On the other hand, a bottom surface 60 of the board 70 is formed with pads 61 and an insulating material 62 which inhibits migration. Openings 65 are formed in the insulating layer 62 immediately below the pads 61. The openings 65 serve for formation of solder bumps or the like. In recent years, the pitch of the openings 65 has been decreased at a higher rate. An example of the pitch reduction is such that the width a and the pitch b of the openings 65 are less than 100 μm and less than 150 μm, respectively FIG. 14 is an enlarged view of one of the openings 65 and its vicinity 67. As shown, the opening 65 is formed in the insulating layer 62 over the pad 61 that is formed on the board 70. The opening 65 is intended to allow a bump 63 to be so formed as to be charged in the opening 65. The opening 65 is defined by the insulating layer 62. Since the insulating layer is also left in a resulting product, it is required to have good migration resistance etc. Therefore, this example is the same as the case of resist dams in that high resolution is required in the manufacturing process and high reliability is required in the product.

Figure 15:
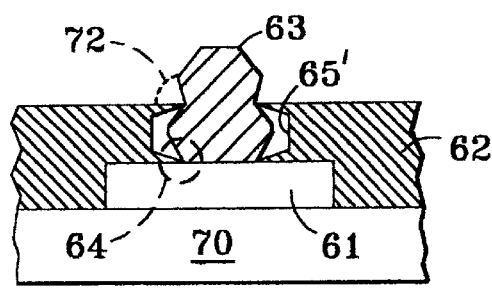
FIG. 15 is a sectional view of an inferior resin layer for bump formation.

The technique of the invention is effective in patterning the above insulating layer 62. With an ultraviolet-curable resist also having high reliability (the resolution is typically lowered as the reliability is increased), it is difficult to perform this kind of precision patterning. The use of such an ultraviolet-curable resist causes, for instance, phenomena as shown in FIG. 15: a resist residue 64 and an overhang 72 may occur above the pad 61 and in the opening 65', respectively. These phenomena are caused by reflection of ultraviolet rays by the pad surface during exposure or a low transmittance of ultraviolet rays. As a result, the bump 63 formed approximately assumes a shape of two spheres joined together, rather than a sphere. This reduces the contact area with the pad 61, lowering the reliability of the connection. In addition, the existence of the overhang 72 makes it difficult to perform, for instance, gold plating in a manufacturing process.

The invention is desirable in forming a pattern to exclude desired portions to form a resist pattern by using a high resolution insulative layer, then a resist pattern is formed at the desired portions by using a highly reliable insulative layer, and finally the high resolution insulative layer is removed. In this manner, the invention is also useful in forming a fine-pitch resist pattern for bumps, BGA, etc. Referring to FIG. 14, a high resolution insulative layer (not shown) is formed only on the pad 61 in the first step. Specifically, this is done by performing exposure and development after covering the board 70 with a high resolution organic material film (not shown). Since this insulative layer 62 has high resolution, it can be formed approximately at the same position where the bump 63 will be positioned. Next, a highly reliable solder resist 62 is formed. Finally, the high resolution organic material film is removed by dissolution, for instance. This method is the same as the method described above for the formation of resist dams.

Although the above description has been made with an assumption that the resist is of a negative type, it is apparent that those skilled in the art can practice the invention even by using a positive resist. Further, although the above description is directed to the case of using the high resolution, photoreactive resist, the invention can also be practiced with a material and a process which enable high resolution. For example, it is conceivable to effect exposure by scanning with an ion beam or a laser beam instead of performing the above exposure and development steps. High resolution can be attained by a certain means by using a material and a process which allow removal of the material used. Further, although in the above description the thermosetting solder resist is used as a typical example of the material that is left in a product, the invention is not limited to the use of a thermosetting organic material, provided that the material can assure high reliability in the product state. Further, the conditions to be satisfied do not include not being photosensitive. For example, the invention can be practiced with a ceramic paste. For certain purposes, a conductive metal paste can also be used. In addition, although this specification is directed to the case where the contradictory properties required are resolution and migration resistance, the invention is not limited to such a case.

The essence of the invention resides in that where there exists a need for a layer that should satisfy a plurality of contradictory properties, in view of the fact that those properties are required for different steps in forming the layer concerned, a layer that satisfies part of the above properties is formed by using a material and a process most suitable for each step when no contradictory properties are required in each step.

According to the invention, an insulative layer can be patterned with high precision in order to accommodate the pitch reduction of wiring conductors. In particular, the invention is effective in forming resist dams of a precision pattern in the current situation in which the wiring density has become very high. Further, the invention can construct a structure, such as resist dams or other structure that can benefit from the formation of a precision opening, that is left in a product by using a thermosetting resist to compensate for low reliability of an ultraviolet-curable resist that is also employed to utilize its high resolution. Thus, the invention enables formation of an insulating material structure having high precision and high reliability.

What is claimed is:

1. A method for forming a layer having a high precision pattern on a substrate, comprising the steps of:
    (a) forming a first layer of a first material having a resolution property in a predetermined pattern having at least one opening on a substrate; and
    (b) forming a second insulative layer of a second material in the at least one opening, the second material having a resolution property lower than that of the first material.

2. The method of claim 1 further comprising the step of (c) removing the first material.

3. The method of claim 1 wherein the substrate has at least one conductor or pad and the at least one opening is formed adjacent to the conductor or pad.

4. The method of claim 3 further comprising the steps of creating at least one second opening in the first material and introducing a conductive member into the second opening.

5. The method of claim 1 wherein the first material is photosensitive.

6. The method of claim 1 wherein the first material is strippable.

7. The method of claim 1 wherein the second material is not photopolymerizable.

8. The method of claim 1 wherein the second material inhibits migration.

9. A method of forming a layer having a precision pattern in a substrate comprising the steps of:
    (a) providing a substrate having photosensitive first material thereon;
    (b) exposing the first material to light in an amount effect to obtain a reaction;
    (c) developing the first material to remove a portion thereof and create at least one precision opening in the first material; and
    (d) introducing a second insulative material in the opening, the second material being effective to inhibit migration.

10. The method of claim 9 further comprising the step of (e) removing the first material.

11. The method of claim 9 wherein the substrate has at least one conductor and the at least one opening is formed adjacent to the conductor.

12. The method of claim 11 further comprising the steps of creating at least one second opening in the first material and introducing a conductive member into the second opening.

13. The method of claim 9 wherein the first material is photosensitive.

14. The method of claim 9 wherein the first material is strippable.

15. The method of claim 9 wherein the second material is not photopolymerizable.

16. A method of forming a layer having a precision pattern in a substrate comprising the steps of:
    (a) providing a substrate having at least one conductor or pad and first material on the substrate;
    (b) removing a first portion of the first material adjacent the at least one conductor or pad to create at least one first precision opening therein;
    (c) introducing a second material in the first opening;
    (d) removing a second portion of the first material over the at least one conductor or pad to create at least one second opening therein; and
    (e) introducing a conductor material in the second opening.

* * * * *